(12) United States Patent
Kang et al.

(10) Patent No.: US 12,183,665 B2
(45) Date of Patent: Dec. 31, 2024

(54) SEMICONDUCTOR PACKAGE

(71) Applicant: Samsung Electronics Co., Ltd., Suwon-si (KR)

(72) Inventors: Myungsam Kang, Suwon-si (KR); Youngchan Ko, Seoul (KR); Jeongseok Kim, Cheonan-si (KR); Kyung Don Mun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/423,229

(22) Filed: Jan. 25, 2024

(65) Prior Publication Data
US 2024/0162133 A1 May 16, 2024

Related U.S. Application Data

(63) Continuation of application No. 17/551,938, filed on Dec. 15, 2021, now Pat. No. 11,916,002.

(30) Foreign Application Priority Data

May 3, 2021 (KR) .................. 10-2021-0057375

(51) Int. Cl.
| | |
|---|---|
| *H01L 23/498* | (2006.01) |
| *H01L 23/00* | (2006.01) |
| *H01L 23/31* | (2006.01) |
| *H01L 23/538* | (2006.01) |
| *H01L 25/18* | (2023.01) |

(52) U.S. Cl.
CPC .... *H01L 23/49822* (2013.01); *H01L 23/3157* (2013.01); *H01L 23/49811* (2013.01); *H01L 23/5389* (2013.01); *H01L 24/08* (2013.01); *H01L 25/18* (2013.01); *H01L 2224/08235* (2013.01)

(58) Field of Classification Search
CPC .......... H01L 23/49822; H01L 23/3157; H01L 23/49811; H01L 25/5389; H01L 24/08; H01L 25/18
See application file for complete search history.

(56) References Cited

U.S. PATENT DOCUMENTS

| | | | |
|---|---|---|---|
| 9,502,391 | B2 | 11/2016 | Kwon et al. |
| 9,607,947 | B2 | 3/2017 | Karhade et al. |
| 9,984,979 | B2 | 5/2018 | Park et al. |

(Continued)

*Primary Examiner* — Nathan W Ha
(74) *Attorney, Agent, or Firm* — Muir Patent Law, PLLC

(57) ABSTRACT

Disclosed is a semiconductor package comprising a package substrate, an interposer substrate on the package substrate and including a first redistribution substrate, a second redistribution substrate on a bottom surface of the first redistribution substrate, and an interposer molding layer between the first redistribution substrate and the second redistribution substrate, a connection substrate on the interposer substrate and having a connection hole that penetrates the connection substrate, a first semiconductor chip on the interposer substrate and in the connection hole, a second semiconductor chip on the interposer substrate, in the connection hole and horizontally spaced apart from the first semiconductor chip, and a connection semiconductor chip in the interposer molding layer and on the bottom surface of the first redistribution substrate.

20 Claims, 15 Drawing Sheets

(56) References Cited

U.S. PATENT DOCUMENTS

| | | |
|---|---|---|
| 10,403,599 B2 | 9/2019 | Delacruz et al. |
| 2020/0176384 A1 | 6/2020 | Wu et al. |
| 2020/0235065 A1 | 7/2020 | Chang et al. |
| 2020/0243449 A1 | 7/2020 | Chiang et al. |
| 2021/0028147 A1 | 1/2021 | Yu et al. |
| 2022/0037306 A1* | 2/2022 | You .................... H01L 25/0657 |
| 2022/0045008 A1* | 2/2022 | Kang .................. H01L 23/5385 |

* cited by examiner

SEMICONDUCTOR PACKAGE

CROSS-REFERENCE TO RELATED APPLICATION

This application is a continuation application of U.S. patent application Ser. No. 17/551,938 filed on Dec. 15, 2021, which claims the benefit of priority under 35 U.S.C § 119 to Korean Patent Application No. 10-2021-0057375 filed on May 3, 2021 in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a redistribution substrate and a method of fabricating the same.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the recent development of the electronics industry, semiconductor packages are variously developed to reach the goal of compact size, small weight, and/or low manufacturing cost. In addition, many kinds of semiconductor packages show up with the expansion of their application field such as high-capacity mass storage devices.

SUMMARY

Some embodiments of the present inventive concepts provide a semiconductor package with improved electrical characteristics.

The object of the present inventive concepts is not limited to the mentioned above, and other objects which have not been mentioned above will be clearly understood to those skilled in the art from the following description.

According to some embodiments of the present inventive concepts, a semiconductor package may comprise: a package substrate; an interposer substrate on the package substrate, the interposer substrate including a first redistribution substrate, a second redistribution substrate on a bottom surface of the first redistribution substrate, and an interposer molding layer between the first redistribution substrate and the second redistribution substrate; a connection substrate on the interposer substrate, the connection substrate having a connection hole that penetrates the connection substrate; a first semiconductor chip on the interposer substrate, the first semiconductor chip being in the connection hole; a second semiconductor chip on the interposer substrate, the second semiconductor chip being in the connection hole and horizontally spaced apart from the first semiconductor chip; and a connection semiconductor chip in the interposer molding layer and on the bottom surface of the first redistribution substrate.

According to some embodiments of the present inventive concepts, a semiconductor package may comprise: a package substrate; an interposer substrate on the package substrate, the interposer substrate including a first redistribution substrate, a second redistribution substrate on a bottom surface of the first redistribution substrate, and an interposer molding layer between the first redistribution substrate and the second redistribution substrate; a connection semiconductor chip in the interposer molding layer and on the bottom surface of the first redistribution substrate, the connection semiconductor chip having a first surface facing the second redistribution substrate; and a first semiconductor chip on the interposer substrate. The interposer molding layer may be between the second redistribution substrate and the first surface of the connection semiconductor chip.

According to some embodiments of the present inventive concepts, a semiconductor package may comprise: a package substrate; an interposer substrate on the package substrate, the interposer substrate including a first redistribution substrate, a second redistribution substrate on a bottom surface of the first redistribution substrate, and an interposer molding layer between the first redistribution substrate and the second redistribution substrate; a connection substrate on the interposer substrate, the connection substrate having a connection hole that penetrates the connection substrate; a first semiconductor chip on the interposer substrate, the first semiconductor chip being in the connection hole; a second semiconductor chip on the interposer substrate, the second semiconductor chip being in the connection hole and horizontally spaced apart from the first semiconductor chip; a connection semiconductor chip in the interposer molding layer and on the bottom surface of the first redistribution substrate; a capacitor chip on the bottom surface of the first redistribution substrate, the capacitor chip being in the interposer molding layer and horizontally spaced apart from the connection semiconductor chip; and a molding layer on the interposer substrate, the molding layer covering a sidewall of the first semiconductor chip, a sidewall of the second semiconductor chip, and the connection substrate.

DETAILED DESCRIPTION OF EMBODIMENTS

Some embodiments of the present inventive concepts will now be described in detail with reference to the accompanying drawings to aid in clearly explaining the present inventive concepts.

Figure 1:
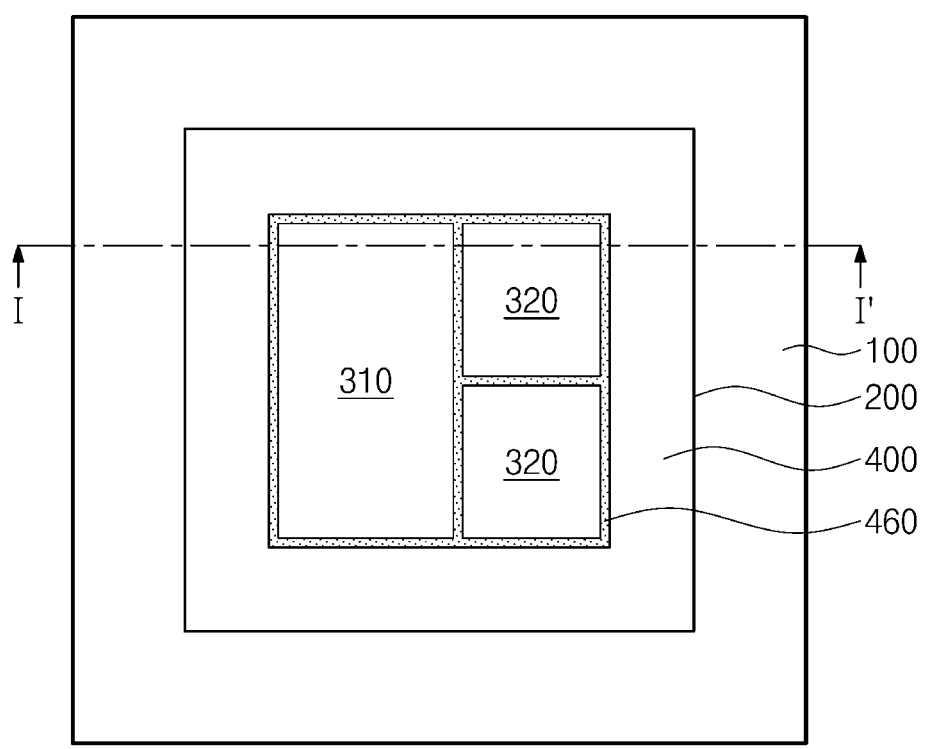
FIG. 1 illustrates a plan view showing a semiconductor package according to some embodiments of the present inventive concepts.
Figure 2:
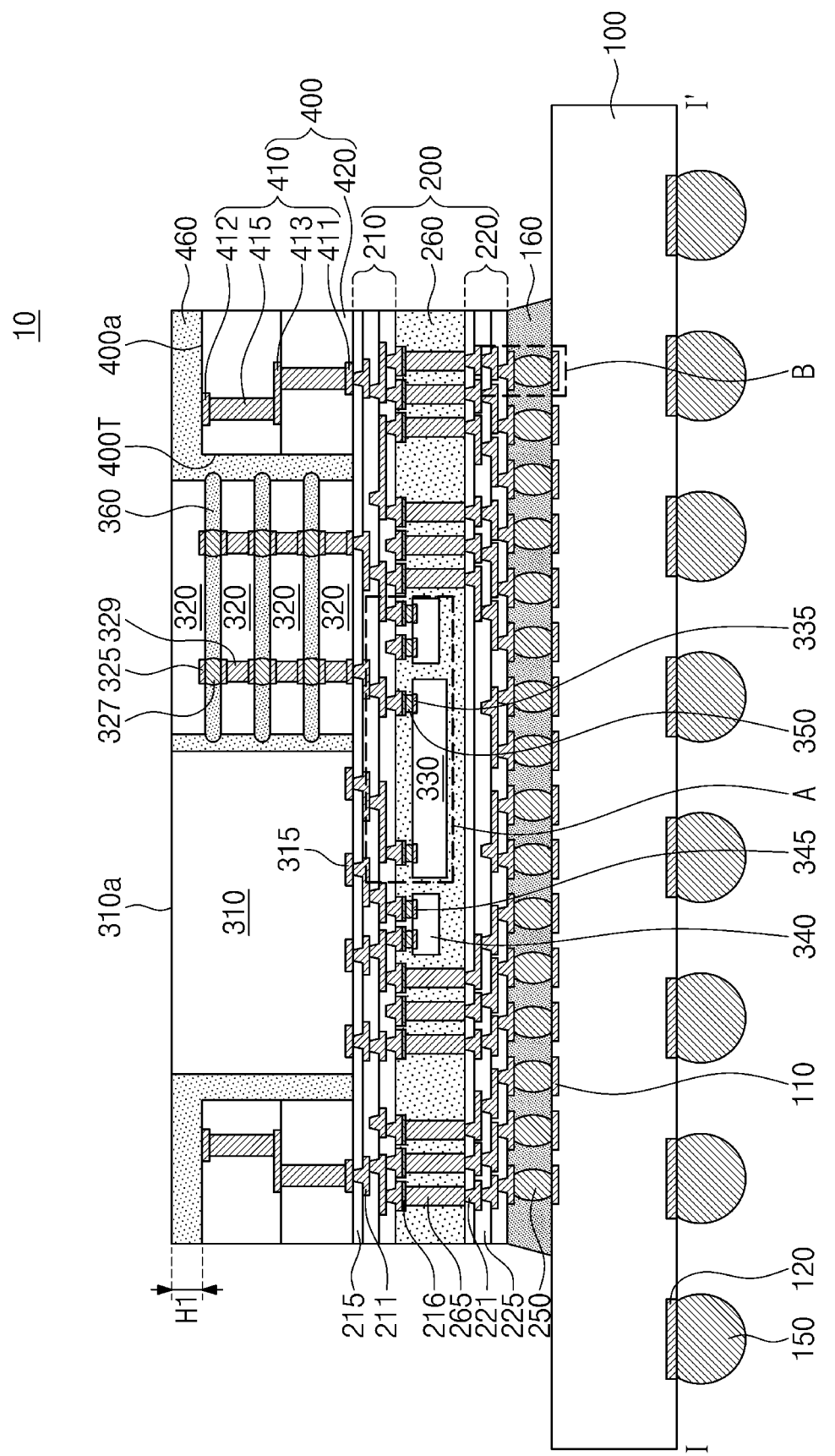
FIG. 2 illustrates a cross-sectional view taken along line I-I' of FIG. 1, showing a semiconductor package according to some embodiments of the present inventive concepts.
Figure 3:
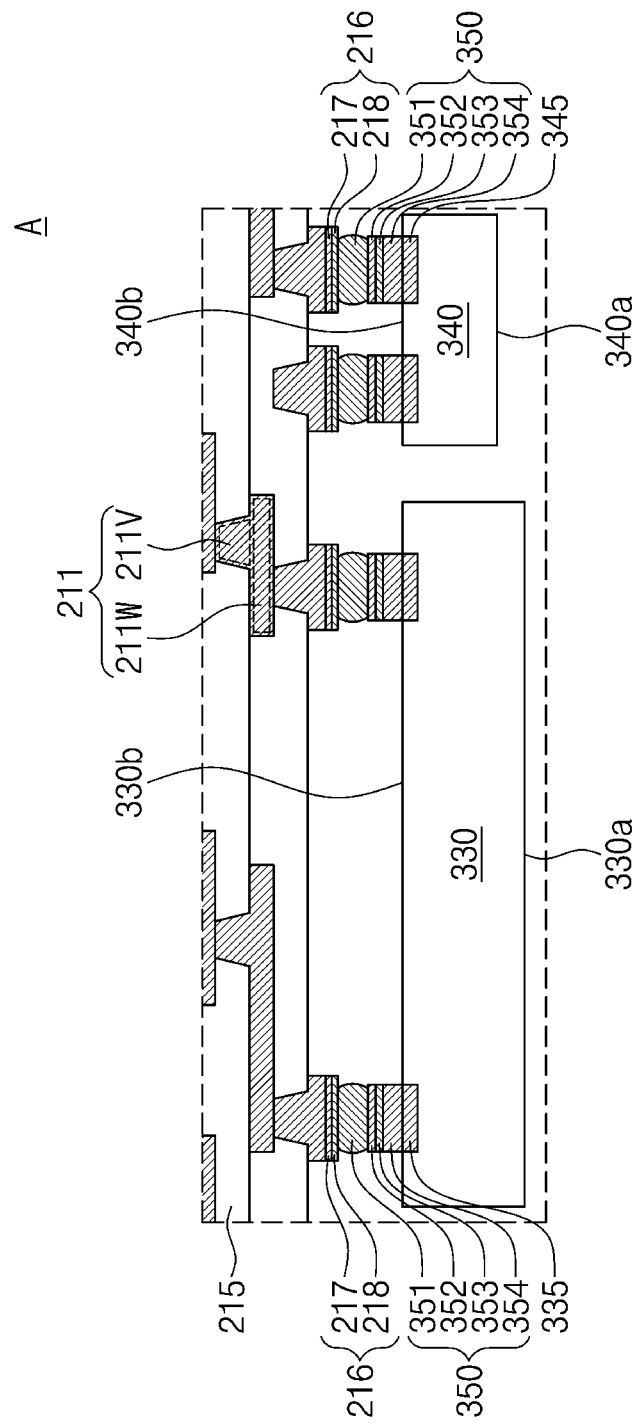
FIG. 3 illustrates an enlarged view showing section A of FIG. 2.
Figure 4A:
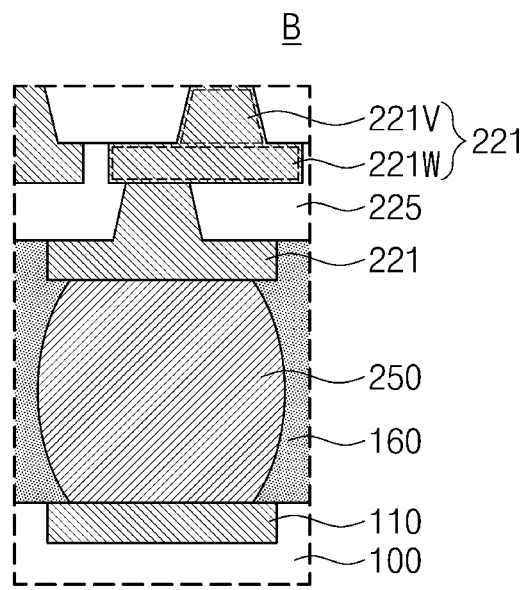
FIGS. 4A and 4B illustrate enlarged views showing section B of FIG. 2.
Figure 4B:
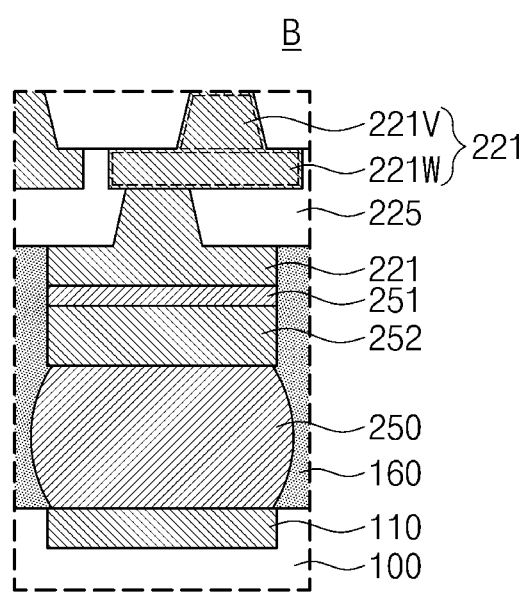

FIG. 1 illustrates a plan view showing a semiconductor package according to some embodiments of the present inventive concepts. FIG. 2 illustrates a cross-sectional view taken along line I-I' of FIG. 1, showing a semiconductor package according to some embodiments of the present inventive concepts. FIG. 3 illustrates an enlarged view showing section A of FIG. 2. FIGS. 4A and 4B illustrate enlarged views showing section B of FIG. 2.

Referring to FIGS. 1, 2, 3, 4A, and 4B, a semiconductor package 10 may include a package substrate 100, an interposer substrate 200, a first semiconductor chip 310, a second semiconductor chip 320, a connection semiconductor chip 330, a connection substrate 400, and a molding layer 460.

The package substrate 100 may include substrate pads 110 and terminal pads 120. For example, the package substrate 100 may be a printed circuit board (PCB). The substrate pads 110 may be adjacent to a top surface of the package substrate 100, and the terminal pads 120 may be adjacent to a bottom surface of the package substrate 100. For example, the substrate pads 110 may be formed on the top surface of the package substrate 100, and the terminal pads 120 may be formed on the bottom surface of the package substrate 100. The substrate pads 110 may be exposed on the top surface of the package substrate 100. The package substrate 100 may be provided with substrate wiring lines (not shown) therein. The substrate pads 110 and the terminal pads 120 may be electrically connected to the substrate wiring lines (not shown). In this description, when "two components are electrically connected/coupled to each other," "the two components may be directly connected to each other or indirectly connected to each other through other conductive component(s)." The substrate pads 110 and the terminal pads 120 may include or be formed of a conductive metallic material, for example at least one metal selected from copper (Cu), aluminum (Al), tungsten (W), and titanium (Ti).

As used herein, components described as being "electrically connected" are configured such that an electrical signal can be transferred from one component to the other (although such electrical signal may be attenuated in strength as it transferred and may be selectively transferred).

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

The package substrate 100 may be provided with external terminals 150 on the bottom surface thereof. The external terminals 150 may be located on bottom surfaces of the terminal pads 120, and may be electrically connected to the terminal pads 120. The external terminals 150 may be coupled to an external device. Therefore, external electric signals may be transmitted to the substrate pads 110 from the external device via the external terminals 150. Electric signals may also be transmitted to the external device from the substrate pads 110 via the external terminals 150. The external terminals 150 may include or may be solder balls or solder bumps. The external terminals 150 may include or be formed of a conductive metallic material, for example, at least one metal selected from tin (Sn), lead (Pb), silver (Ag), zinc (Zn), nickel (Ni), gold (Au), copper (Cu), aluminum (Al), and bismuth (Bi).

The interposer substrate 200 may be located on the package substrate 100. The interposer substrate 200 may be disposed between the package substrate 100 and the first semiconductor chip 310 and between the package substrate 100 and the second semiconductor chip 320. The interposer substrate 200 may include a first redistribution substrate 210, a second redistribution substrate 220, and an interposer molding layer 260. The interposer molding layer 260 may be interposed between the first redistribution substrate 210 and the second redistribution substrate 220. The first redistribution substrate 210 may be positioned between the first semiconductor chip 310 and the interposer molding layer 260. The second redistribution substrate 220 may be positioned between the package substrate 100 and the interposer molding layer 260.

The first redistribution substrate 210 may include a first redistribution dielectric layer 215 and a first redistribution pattern 211. For example, a single first redistribution dielectric layer 215 may be provided in the first redistribution substrate 210, or a plurality of stacked first redistribution layers may be provided in the first redistribution substrate 210. In some embodiments, no distinct interface may be provided between neighboring two of the first redistribution dielectric layers 215. For example, there may be no grain boundaries between the stacked first redistribution dielectric layers 215. The number of stacked first redistribution dielectric layers 215 may be variously changed without being limited to that shown in FIG. 2. The first redistribution dielectric layer 215 may include or be formed of a dielectric polymer or a photo-imageable dielectric (PID) polymer. For example, the photo-imageable dielectric polymer may include or may be at least one selected from photosensitive polyimide, polybenzoxazole (PBO), phenolic polymers, and benzocyclobutene polymers.

The first redistribution pattern 211 may be provided in the first redistribution dielectric layer 215. A plurality of first redistribution patterns 211 may be provided in a first redistribution layer 215. As illustrated in FIG. 3, each of the first redistribution patterns 211 may include or be formed of a first wire part 211W and a first via part 211V. In this description, a via part of a certain component may be a segment for vertical connection, and a wire part of a certain component may be a segment for horizontal connection. In this case, the wire part may have a width greater than that of the via part, e.g., in a horizontal direction perpendicular to a lengthwise direction of the wire part. For example, the wire part may extend in a horizontal direction, and the via part may extend in a vertical direction. The first wire part 211W may have a major axis that extends in a direction parallel to the top surface of the package substrate 100. The first wire part 211W may have a width greater than that of the first via part 211V. The first via part 211V may be located on the first wire part 211W. The first via part 211V may have a shape that protrudes toward a top surface of the interposer substrate 200, e.g., from the first wire part 211W formed integrally with the first via part 211V. An uppermost portion of the first via part 211V may have a width less than that of a lowermost portion of the first via part 211V. The first redistribution pattern 211 may include or be formed of a conductive material, for example, at least one selected from copper (Cu), tungsten (W), and titanium (Ti). Differently from that shown in the figures, the semiconductor package 10 according to the present inventive concepts may be configured such that two first redistribution dielectric layers 215 may be included in the first redistribution substrate 210, and that the first redistribution patterns 211 may be located in each of the two first redistribution dielectric layers 215.

One or more conductive patterns 216 may be located on a bottom surface of a lowermost one of the first redistribution patterns 211. The conductive pattern 216 may be in contact with a bottom surface of the first wire part 211W of the lowermost first redistribution pattern 211. The conductive pattern 216 may include or be formed of a conductive material, for example, at least one selected from nickel (Ni) and gold (Au). As illustrated in FIG. 3, the conductive pattern 216 may include or be formed of a first conductive pattern 217 and a second conductive pattern 218. The first conductive pattern 217 and the second conductive pattern 218 may be sequentially stacked on the bottom surface of the lowermost first redistribution pattern 211. For example, the second conductive pattern 218 may be spaced apart from the lowermost first redistribution pattern 211 across the first conductive pattern 217. For example, the first conductive pattern 217 may be interposed between the lowermost first redistribution pattern 211 and the second conductive pattern 218. The first conductive pattern 217 may be in contact with the bottom surface of the first wire part 211W of the lowermost first redistribution pattern 211. The second conductive pattern 218 may be in contact with a bottom surface of the first conductive pattern 217. The first conductive pattern 217 may include or be formed of a conductive material, for example, nickel (Ni). The second conductive pattern 218 may include or be formed of a conductive material, for example, gold (Au).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The connection semiconductor chip 330 and a capacitor chip 340 may be mounted on a bottom surface of the first redistribution substrate 210. The connection semiconductor chip 330 and the capacitor chip 340 may be located in the interposer molding layer 260. The connection semiconductor chip 330 and the capacitor chip 340 may be disposed to be horizontally spaced apart from each other. In a plan view, the connection semiconductor chip 330 may be located between the first semiconductor chip 310 and the second semiconductor chip 320. For example, a portion of the connection semiconductor chip 330 may vertically overlap a portion of the first semiconductor chip 310, and another portion of the connection semiconductor chip 330 may vertically overlap a portion of the second semiconductor chip 320. The connection semiconductor chip 330 may have a first surface 330a adjacent to the second redistribution substrate 220 and a second surface 330b adjacent to the first redistribution substrate 210. The capacitor chip 340 may have a first surface 340a adjacent to the second redistribution substrate 220 and a second surface 340b adjacent to the first redistribution substrate 210. For example, the first surface 330a of the connection semiconductor chip 330 and the first surface 340a of the capacitor chip 340 may face a top surface of the second redistribution substrate 220, and the second surface 330b of the connection semiconductor chip 330 and the second surface 340b of the capacitor chip 340 may face a bottom surface of the first redistribution substrate 210. Neither the first surface 330a of the connection semiconductor chip 330 nor the first surface 340a of the capacitor chip 340 may be in contact with a top surface of the second redistribution substrate 220.

The connection semiconductor chip 330 may include first conductive pads 335. The first conductive pads 335 may be exposed on the second surface 330b of the connection semiconductor chip 330. The capacitor chip 340 may include second conductive pads 345. The second conductive pads 345 may be exposed on the second surface 340b of the capacitor chip 340. The first conductive pads 335 and the second conductive pads 345 may include or be formed of a conductive material, for example, copper (Cu).

Conductive connectors 350 may be interposed between the first redistribution substrate 210 and the connection semiconductor chip 330 and between the first redistribution substrate 210 and the capacitor chip 340. The conductive connectors 350 may be located on bottom surfaces of the conductive patterns 216 provided on a central region of the interposer substrate 200. The connection semiconductor chip 330 and the capacitor chip 340 may be electrically connected through the conductive connectors 350 to the first redistribution substrate 210. The first conductive pad 335 may be electrically connected through a corresponding one of the conductive connectors 350 to a corresponding one of the lowermost first redistribution patterns 211. The second conductive pad 345 may be electrically connected through a corresponding one of the conductive connectors 350 to a corresponding one of the lowermost first redistribution patterns 211. The conductive connectors 350 may include or be formed of a conductive material, and may have at least one selected from solder-ball shapes, bump shapes, and pillar shapes.

As illustrated in FIG. 3, each of the conductive connectors 350 may include a solder bump 351, a first bump pattern 352, a second bump pattern 353, and a third bump pattern 354. The solder bump 351 may be in contact with the conductive pattern 216. The first bump pattern 352 may be interposed between the solder bump 351 and the second bump pattern 353. The second bump pattern 353 may be interposed between the first bump pattern 352 and the third bump pattern 354. In this description, the first bump pattern 352, the second bump pattern 353, and the third bump pattern 354 may each be called a bump pattern. The bump patterns 352, 353, and 354 may have a pillar shape. The solder bump 351 may include or be formed of a conductive material, for example, at least one selected from tin (Sn), silver (Ag), and lead (Pb). The first bump pattern 352 may include or be formed of a conductive material, for example, copper (Cu). The second bump pattern 353 may include or be formed of a conductive material, for example, nickel (Ni). The third bump pattern 354 may include or be formed of a conductive material, for example, copper (Cu).

The connection semiconductor chip 330 may be a silicon-containing passive chip, for example, a bridge chip or an interconnect chip that electrically connect the first semiconductor chip 310 and the second semiconductor chip 320 that are horizontally spaced apart from each other. For example, the capacitor chip 340 may be a capacitor including silicon (Si). The semiconductor package 10 may include a plurality of connection semiconductor chips 330 and a plurality of capacitor chips 340. The number of the connection semiconductor chips 330 and the number of the capacitor chips 340 may be variously changed without being limited to that shown in the drawings.

According to the present inventive concepts, as the interposer substrate 200 is provided therein with the connection semiconductor chip 330 and the capacitor chip 340, the semiconductor package 10 may be improved in the degree of freedom of design and may be beneficial in reducing its size. In addition, as the capacitor chip 340 is disposed in the interposer substrate 200, it may be beneficial to effectively remove noise from power signals or input signals and to provide the semiconductor package 10 with an increased power integrity.

A conductive post 265 may be located on the bottom surface of the first redistribution substrate 210 and on the top surface of the second redistribution substrate 220. For example, the conductive post 265 may be interposed between the first redistribution substrate 210 and the second redistribution substrate 220. The conductive post 265 may be electrically connected to a corresponding one of the lowermost first redistribution patterns 211. A plurality of conductive posts 265 may be provided between the first redistribution substrate 210 and the second redistribution substrate 220. The plurality of conductive posts 265 may be located in the interposer molding layer 260. The conductive posts 265 may be disposed to be horizontally spaced apart from the connection semiconductor chip 330 and the capacitor chip 340. In a plan view, the conductive posts 265 may be located to surround the connection semiconductor chip 330 and the capacitor chip 340. The conductive posts 265 may be placed on bottom surfaces of the conductive patterns 216 provided on an edge region of the interposer substrate 200. The first redistribution substrate 210 and the second redistribution substrate 220 may be electrically connected to each other through the conductive posts 265. The conductive posts 265 may be metal pillars and may include or be formed of, for example, copper (Cu). The conductive post 265 may have a width less than that of the conductive pattern 216, e.g., in a horizontal direction (or that of the first wire part 211W of the lowermost first redistribution pattern 211).

The interposer molding layer 260 may cover the connection semiconductor chip 330 and the capacitor chip 340. The interposer molding layer 260 may be interposed between the top surface of the second redistribution substrate 220 and the first surface 330a of the connection semiconductor chip 330 and between the bottom surface of the first redistribution substrate 210 and the second surface 330b of the connection semiconductor chip 330. The interposer molding layer 260 may be interposed between the top surface of the second redistribution substrate 220 and the first surface 340a of the capacitor chip 340 and between the bottom surface of the first redistribution substrate 210 and the second surface 340b of the capacitor chip 340. The interposer molding layer 260 may encapsulate sidewalls of the conductive posts 265. For example, the interposer mold layer 260 may surround the connection semiconductor chip 330 and the capacitor chip 340 by contacting side surfaces and bottom and top surfaces (330a, 330b, 340a and 340b) of the connection semiconductor chip 330 and the capacitor chip 340. The interposer molding layer 260 may include or be formed of a dielectric polymer, such as an epoxy molding compound (EMC).

The second redistribution substrate 220 may include a second redistribution dielectric layer 225 and a second redistribution pattern 221. The second redistribution substrate may include a plurality of dielectric layers 225 or may include a single second redistribution dielectric layer 225. In some embodiments, no distinct interface may be provided between neighboring two of the second redistribution dielectric layers 225. For example, there may be no grain boundaries between stacked second redistribution dielectric layers 215. The number of stacked second redistribution dielectric layers 225 may be variously changed without being limited to that shown in the figures. The second redistribution dielectric layer 225 may include or be formed of a dielectric polymer or a photo-imageable dielectric (PID) polymer. For example, the photo-imageable dielectric polymer may include or may be at least one selected from photosensitive polyimide, polybenzoxazole (PBO), phenolic polymers, and benzocyclobutene polymers.

The second redistribution pattern 221 may be provided in the second redistribution dielectric layer 225. A plurality of second redistribution patterns 221 may be provided in the second redistribution dielectric layer 225. As illustrated in FIG. 4A or 4B, each of the second redistribution patterns 221 may include a second wire part 221W and a second via part 221V. The second wire part 221W may have a major axis that extends in a direction parallel to the top surface of the package substrate 100. The second wire part 221W may have a width greater than that of the second via part 221V, e.g., in a horizontal direction. The second via part 221V may be located on the second wire part 221W. The second via part 221V may have a shape that protrudes toward the top surface of the interposer substrate 200 from the second wire part 221W formed on a bottom surface of a second redistribution dielectric layer 225. An uppermost portion of the second via part 221V may have a width less than that of a lowermost portion of the second via part 221V. The second redistribution pattern 221 may include or be formed of a conductive material, for example, at least one selected from copper (Cu), tungsten (W), and titanium (Ti). Uppermost ones of the second redistribution patterns 221 may be electrically connected to corresponding ones of the conductive posts 265. For example, the uppermost second redistribution pattern 221 may contact the conductive posts 265. For example, a pitch between the second redistribution patterns 221 that are horizontally spaced apart from each other may be less than a pitch between the first redistribution patterns 211 that are horizontally spaced apart from each other.

As illustrated in FIG. 4A or 4B, interposer bumps 250 may be interposed between the package substrate 100 and the interposer substrate 200. The package substrate 100 and the interposer substrate 200 may be electrically connected to each other through the interposer bumps 250. The substrate pads 110 may be electrically connected through corresponding ones of the interposer bumps 250 to corresponding ones of the lowermost second redistribution patterns 221. The interposer bumps 250 may include or be formed of a conductive material, and may have at least one of solder-ball shapes, bump shapes, and pillar shapes. For example, the interposer bumps 250 may include or be formed of at least one selected from tin (Sn), silver (Ag), and lead (Pb). The interposer bumps 250 may have a pitch less than that of the external terminals 150.

As illustrated in FIG. 4B, according to some embodiments, a bump pad 251 and a bump pillar 252 may be interposed between the lowermost second redistribution pattern 221 and the interposer bump 250. The bump pad 251 may be in contact with the lowermost second redistribution pattern 221, and the bump pillar 252 may be in contact with the interposer bump 250. The bump pillar 252 may have a pillar shape. The bump pad 251 may include or be formed of a conductive material, for example, nickel (Ni). The bump pillar 252 may include a conductive material, for example, copper (Cu).

A substrate under-fill layer 160 may be interposed between the package substrate 100 and the interposer substrate 200. The substrate under-fill layer 160 may fill a space between the interposer bumps 250 and may encapsulate the interposer bumps 250. For example, the under-fill layer 160 may surround the interposer bumps 250 by contacting side walls of the interposer bumps 250. The substrate under-fill layer 160 may include or may be a non-conductive film (NCF), such as an ajinomoto build-up film (ABF).

The connection substrate 400 may be provided on the interposer substrate 200. The connection substrate 400 may be in contact with the top surface of the interposer substrate 200. The connection substrate 400 may have a connection hole 400T that penetrates therethrough. In a plan view, the connection hole 400T may be formed on a central region of the connection substrate 400. The connection hole 400T may exposed the interposer substrate 200. Therefore, the connection substrate 400 may have a tetragonal ring/loop shape in a plan view.

The connection substrate 400 may include a conductive structure 410 and a base layer 420. The connection substrate 400 may include a single base layer 420 or a plurality of stacked base layers 420. The base layer 420 may include or be formed of a dielectric material, for example, at least one selected from carbon-based materials (e.g., graphite or graphene), ceramics, and polymers (e.g., nylon, polycarbonate, or polyethylene). The connection hole 400T may penetrate the base layer 420.

The conductive structure 410 may be provided on the top surface of the interposer substrate 200, and may be electrically coupled to and/or contact a corresponding uppermost one of the first redistribution patterns 211. The conductive structure 410 may be provided in the base layer 420. The conductive structure 410 may be located to be horizontally spaced apart from the first semiconductor chip 310 and the second semiconductor chip 320. The conductive structure 410 may be electrically connected to the interposer substrate 200. For example, the conductive structure 410 may be a metal pillar. The conductive structure 410 may include or be formed of a conductive material, for example, at least one selected from copper (Cu), aluminum (Al), gold (Au), lead (Pb), stainless steels (SUS), silver (Ag), iron (Fe), and any alloy thereof.

The conductive structure 410 may include a first pad 411, a second pad 412, a third pad 413, and vias 415. The first pad 411 may be exposed on a bottom surface of the connection substrate 400. The first pad 411 may be electrically coupled to and/or contact a corresponding one of the vias 415. The second pad 412 may be exposed on a top surface of the connection substrate 400. The second pad 412 may be electrically coupled to and/or contact a corresponding one of the vias 415. The third pad 413 may be interposed between the base layers 420. The vias 415 may penetrate the base layers 420 and may be electrically coupled to and/or contact the third pad 413. The second pad 412 may be electrically connected to the first pad 411 through the vias 415 and the third pad 413. The first pad 411 may be electrically coupled to and/or contact a corresponding uppermost one of the first redistribution patterns 211.

The first semiconductor chip 310 and the second semiconductor chip 320 may be provided in the connection hole 400T of the connection substrate 400. The first semiconductor chip 310 may be mounted on the interposer substrate 200. The first semiconductor chip 310 may be in contact with the top surface of the interposer substrate 200. The first semiconductor chip 310 may include or may be a logic chip, a buffer chip, or a system-on-chip (SOC). For example, the first semiconductor chip 310 may be an application specific integrated circuit (ASIC) chip or an application processor (AP) chip. The ASIC chip may include an application specific integrated circuit (ASIC). The first semiconductor chip 310 may include or may be a central processing unit (CPU) or a graphic processing unit (GPU).

A plurality of second semiconductor chips 320 may be provided in the connection hole 400T. The plurality of second semiconductor chips 320 may be mounted on the interposer substrate 200. For example, the plurality of the second semiconductor chips 320 may be vertically stacked on the interposer substrate 200. A lowermost one of the second semiconductor chips 320 may be in contact with the top surface of the interposer substrate 200. The second semiconductor chips 320 may be disposed to be horizontally spaced apart from the first semiconductor chip 310. The vertically stacked second semiconductor chips 320 may form a chip stack. In some embodiments, a plurality of chip stacks may be provided in the connection hole 400T. The second semiconductor chips 320 may be of a different type from the first semiconductor chip 310. The second semiconductor chips 320 may be memory chips. The memory chips may include or may be high bandwidth memory (HBM) chips. For example, the second semiconductor chips 320 may include or may be dynamic random memory (DRAM) chips. Differently from that shown in FIG. 2, the number of the first semiconductor chip 310 and the number of the second semiconductor chips 320 may be variously changed.

A top surface 310a of the first semiconductor chip 310 may be located at substantially the same level as that of a top surface of an uppermost one of the second semiconductor chips 320. The top surface 310a of the first semiconductor chip 310 may be located at a higher level than that of a top surface 400a of the connection substrate 400. The top surface of the uppermost second semiconductor chip 320 may be located at a higher level than that of the top surface 400a of the connection substrate 400. In this description, the term "level" may indicate a vertical height from the top surface of the package substrate 100. For example, a range of about 10 μm to about 100 μm may be given as a height difference H1 between the top surface 310a of the first semiconductor chip 310 and the top surface 400a of the connection substrate 400.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Each of the second semiconductor chips 320 may include integrated circuits (not shown) and through vias 329. The integrated circuits may be provided in the second semiconductor chips 320. The through vias 329 may penetrate corresponding one of the second semiconductor chips 320 and may have electrical connection with the integrated circuits. The through vias 329 may include or be formed of a conductive material, for example, at least one selected from copper (Cu), aluminum (Al), tungsten (W), and titanium (Ti). In some embodiments, the uppermost second semiconductor chip 320 may not include the through vias 329.

The first semiconductor chip 310 may include first chip pads 315 adjacent to or on a bottom surface thereof. The second semiconductor chips 320 may include second chip pads 325 adjacent to or on one or both of top and bottom surfaces thereof. However, in some embodiments, the second chip pads 325 may not be provided on the top surface of the uppermost second semiconductor chip 320. The first chip pads 315 of the first semiconductor chip 310 and the second chip pads 325 on the bottom surface of the lowermost second semiconductor chip 320 may be in contact with corresponding uppermost ones of the first redistribution patterns 211. The first chip pads 315 and the second chip pads 325 may include or be formed of a conductive material, for example, at least one selected from copper (Cu), aluminum (Al), tungsten (WO, and titanium (Ti).

Chip bumps 327 may be interposed between two neighboring ones of the second semiconductor chips 320. The chip bumps 327 may be electrically connected to the through vias 329 of a corresponding one of the second semiconductor chips 320. The second semiconductor chips 320 may be electrically connected to each other through the chip bumps 327.

A chip under-fill layer 360 may be interposed between neighboring two of the second semiconductor chips 320. The chip under-fill layer 360 may fill a space between the chip bumps 327 and may encapsulate the chip bumps 327. For example, the chip under-fill layer 360 may surround the chip bumps 327 by contacting side walls of the chip bumps 327. For example, the chip under-fill layer 360 may include or may be a non-conductive film (NCF), such as an ajinomoto build-up film (ABF).

The molding layer 460 may be provided on the package substrate 100. The molding layer 460 may cover the top surface of the package substrate 100, a sidewall of the first semiconductor chip 310, sidewalls of the second semiconductor chips 320, the connection substrate 400, and the interposer substrate 200. The molding layer 460 may cover the top surface 400a of the connection substrate 400. The molding layer 460 may expose the top surface 310a of the first semiconductor chip 310. The molding layer 460 may expose the top surface of the uppermost second semiconductor chip 320. For example, the molding layer 460 may have a top surface at substantially the same level as that of the top surface 310a of the first semiconductor chip 310. The molding layer 460 may include or be formed of a dielectric polymer, such as an epoxy molding compound (EMC).

FIGS. 5 to 14 illustrate cross-sectional views showing a method of fabricating a semiconductor package according to some embodiments of the present inventive concepts. Duplicate descriptions of the features described above will be omitted below.

Figure 5:
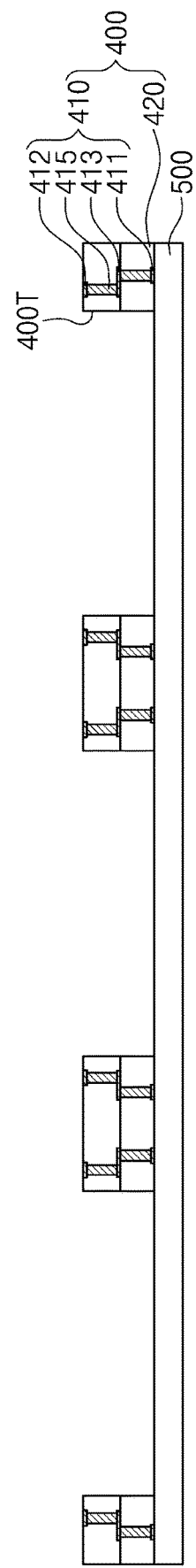
FIGS. 5 to 14 illustrate cross-sectional views showing a method of fabricating a semiconductor package according to some embodiments of the present inventive concepts.

Referring to FIG. 5, a connection substrate 400 may be provided on a first carrier substrate 500. For example, the first carrier substrate 500 may include or be formed of a polymer. The first carrier substrate 500 may include, for example, an adhesive tape, and thus the connection substrate 400 may be attached onto the first carrier substrate 500.

The connection substrate 400 may have a connection hole 400T that penetrates therethrough. The connection hole 400T may expose the first carrier substrate 500. The connection substrate 400 may include a conductive structure 410 and a base layer 420. The connection substrate 400 may include a single base layer 420 or a plurality of stacked base layers 420. The conductive structure 410 may be provided in the base layer 420. The conductive structure 410 may include a first pad 411, a second pad 412, a third pad 413, and vias 415. The first pad 411 may be electrically coupled to and/or contact a corresponding one of the vias 415. The second pad 412 may be exposed on a top surface of the connection substrate 400. The second pad 412 may be electrically coupled to and/or contact a corresponding one of the vias 415. The third pad 413 may be interposed between the base layers 420. The vias 415 may penetrate the base layers 420 and may be electrically coupled to and/or contact the third pad 413. For convenience of description, the following will explain a single package which will be cut in a subsequent sawing process.

Figure 6:
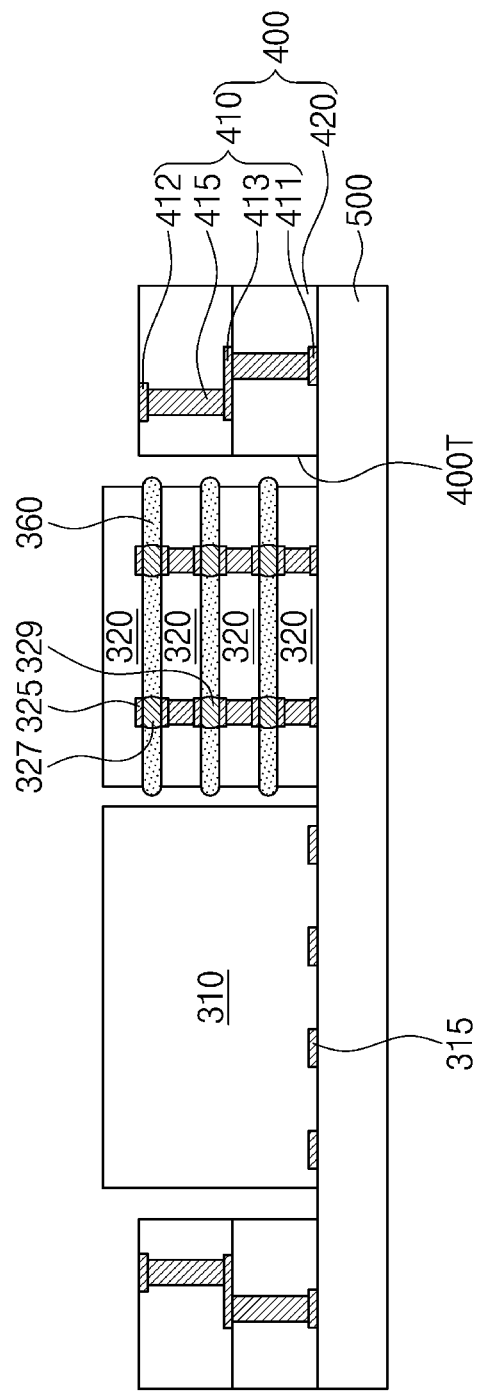

Referring to FIG. 6, a first semiconductor chip 310 and a second semiconductor chip 320 may be provided on the first carrier substrate 500. The first semiconductor chip 310 and the second semiconductor chip 320 may be located in the connection hole 400T of the connection substrate 400. A plurality of second semiconductor chips 320 may be vertically stacked on the second semiconductor chip 320, and thus a chip stack may be formed. The chip stack may be horizontally spaced apart from the first semiconductor chip 310.

The first semiconductor chip 310 may include first chip pads 315 adjacent to or on a bottom surface thereof. Each of the second semiconductor chips 320 may include second chip pads 325 adjacent to or on one or both of top and bottom surfaces thereof. Each of the second semiconductor chips 320 may include through vias 329 that penetrate therethrough. Chip bumps 327 may be interposed between two neighboring ones of the second semiconductor chips 320. A chip under-fill layer 360 may be interposed between neighboring two of the second semiconductor chips 320.

Figure 7:
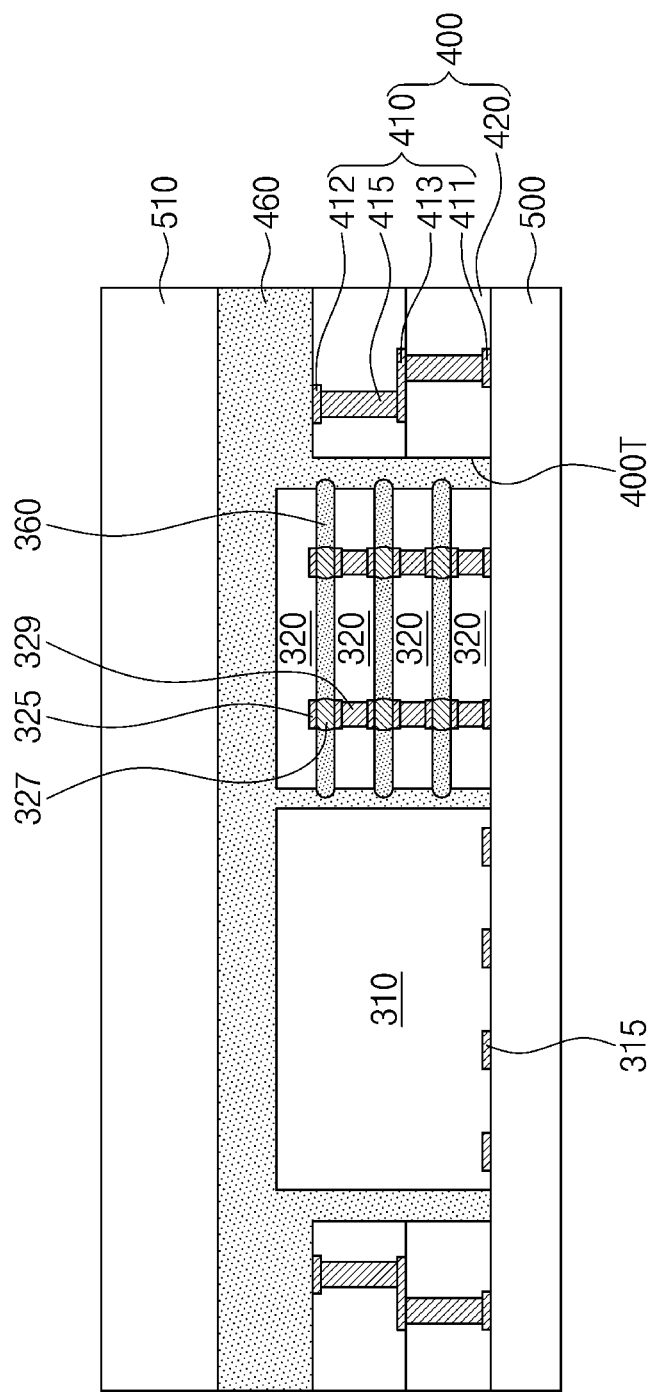

Referring to FIG. 7, a molding layer 460 may be formed on the first carrier substrate 500. The molding layer 460 may cover a top surface of the first carrier substrate 500, the first semiconductor chip 310, the second semiconductor chips 320, and the connection substrate 400. The molding layer 460 may cover a top surface of the first semiconductor chip 310, a top surface of an uppermost one of the second semiconductor chips 320, and the top surface of the connection substrate 400.

A second carrier substrate 510 may be provided on the molding layer 460. The second carrier substrate 510 may be attached onto the molding layer 460.

Figure 8:
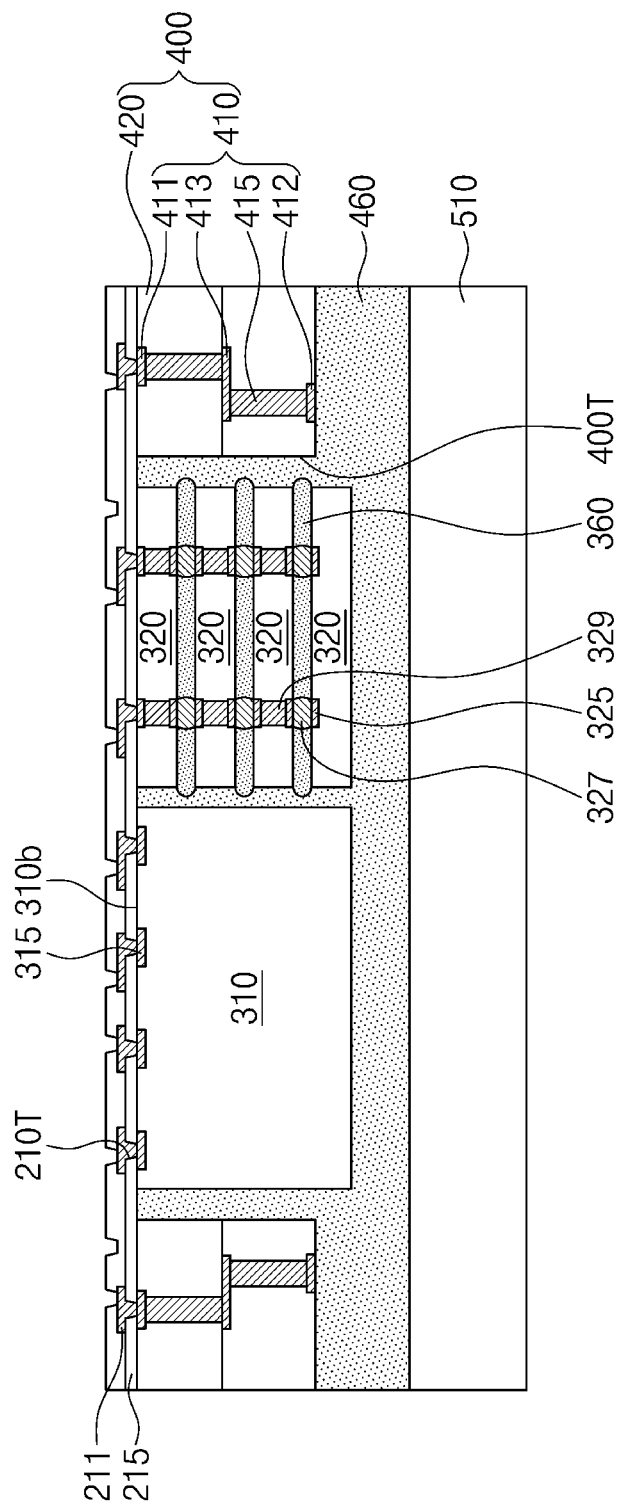

Referring to FIG. 8, the first carrier substrate 500 may be removed to expose the first chip pads 315 formed on or adjacent to a bottom surface 310b of the first semiconductor chip 310 and also to expose the second chip pads 325 formed on or adjacent to a bottom surface of a lowermost one of the second semiconductor chips 320. The second carrier substrate 510 may be turned upside down to allow the bottom surface 310b of the first semiconductor chip 310 to face upwards. For consistency of explanation, the terms "top", "bottom", "upper", "lower", and the like are described based on FIG. 2.

A first redistribution dielectric layer 215 may be formed on the bottom surface 310b of the first semiconductor chip 310. The first redistribution dielectric layer 215 may cover the bottom surface 310b of the first semiconductor chip 310, a bottom surface of the connection substrate 400, and the bottom surface of the lowermost second semiconductor chip 320.

The first redistribution dielectric layer 215 may be patterned to form a plurality of first holes 210T in the first redistribution dielectric layer 215. The first holes 210T may expose the first chip pads 315, the second chip pads 325, and the first pads 411. The first redistribution dielectric layer 215 may be patterned by exposure and development processes. For example, each of the first holes 210T may have a tapered shape.

First redistribution patterns 211 may be formed on the first redistribution dielectric layer 215. For example, the formation of the first redistribution pattern 211 may include forming a seed layer on the first redistribution dielectric layer 215, performing an electroplating process in which the seed layer is used as an electrode to form a conductive layer, and patterning the seed layer and the conductive layer. The conductive layer may include or be formed of metal, such as copper (Cu). The first redistribution pattern 211 may include a first via part provided in the first hole 210T and a first wire part provided on the first redistribution dielectric layer 215.

Figure 9:
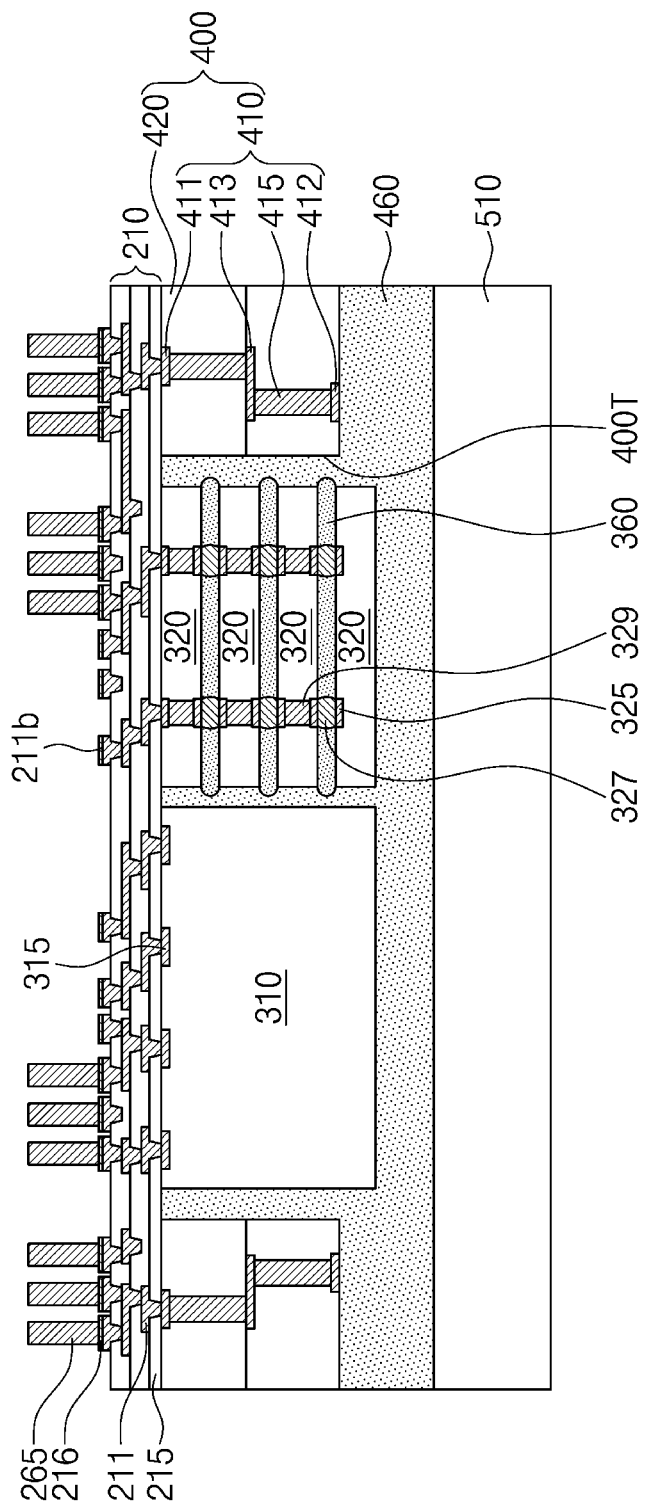

Referring to FIG. 9, the formation of the first redistribution dielectric layer 215 and the first redistribution patterns 211 may be repeatedly performed. Therefore, a first redistribution substrate 210 may be formed which includes a plurality of stacked first redistribution dielectric layers 215 and a plurality of stacked first redistribution patterns 211.

Conductive patterns 216 may be formed on bottom surfaces 211b of lowermost ones of the first redistribution patterns 211. The conductive patterns 216 may each include a first conductive pattern 217 and a second conductive pattern 218, as discussed above with reference to FIG. 3. The formation of the conductive patterns 216 may include forming the first conductive patterns 217 on the bottoms surfaces 211b of the lowermost first redistribution patterns 211 and forming the second conductive patterns 218 on the first conductive patterns 217.

A conductive post 265 may be formed on the conductive pattern 216. A plurality of conductive posts 265 may be formed on the conductive patterns 216. The plurality of conductive posts 265 may be formed on an edge region of the first redistribution substrate 210. The conductive post 265 may not be formed on a central region of the first redistribution substrate 210. The formation of the conductive post 265 may include forming a resist pattern having an opening, performing an electroplating process to fill the opening, and executing a strip process to remove the resist pattern.

Figure 10:
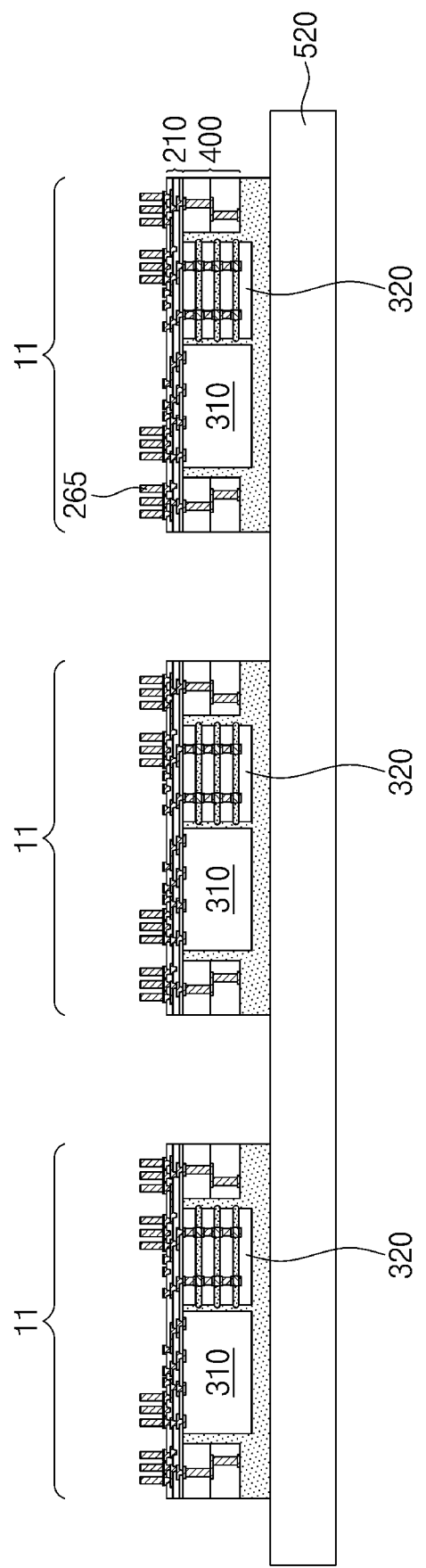

Referring to FIG. 10, the second carrier substrate 510 may be removed. The first redistribution substrate 210 and the connection substrate 400 may be diced to form first preliminary semiconductor packages 11 that are separated from each other. The first preliminary semiconductor packages 11 may be provided on a third carrier substrate 520. The first preliminary semiconductor packages 11 may be attached onto the third carrier substrate 520. For convenience of description, the following will discuss a single first preliminary semiconductor package 11.

Figure 11:
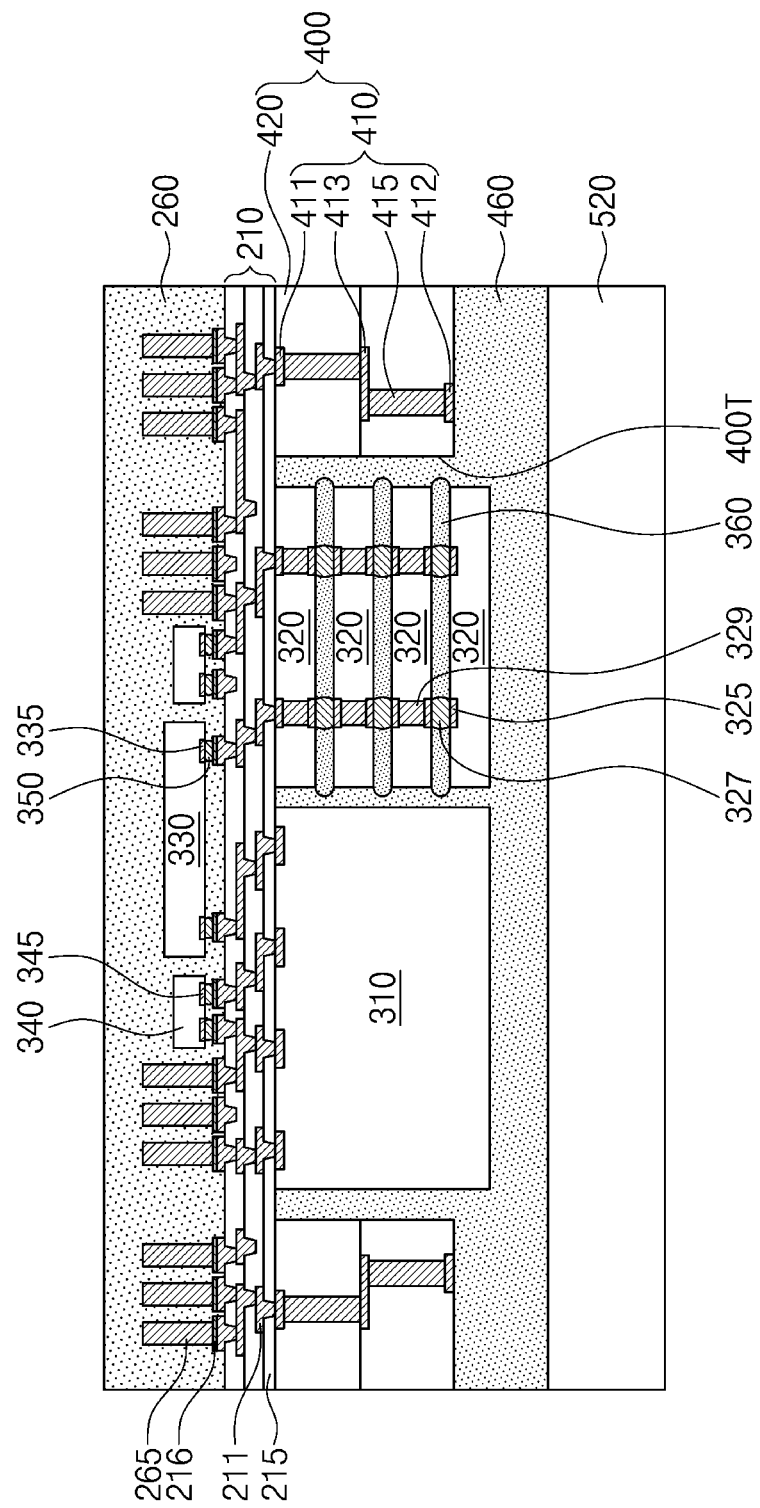

Referring to FIG. 11, a connection semiconductor chip 330 and a capacitor chip 340 may be mounted on the first redistribution substrate 210. The connection semiconductor chip 330 may include first conductive pads 335. The capacitor chip 340 may include second conductive pads 345. The mounting of the connection semiconductor chip 330 may include forming conductive connectors 350 between the first conductive pads 335 of the connection semiconductor chip 330 and their corresponding conductive patterns 216. The mounting of the capacitor chip 340 may include forming conductive connectors 350 between the second conductive pads 345 of the capacitor chip 340 and their corresponding conductive patterns 216.

According to the present inventive concepts, after the first semiconductor chip 310 and the stack of the second semiconductor chips 320 are mounted, the first redistribution substrate 210 may be formed in a fixed state by the first, second, and third carrier substrates 500, 510, and 520, and then the connection semiconductor chip 330 and the capacitor chip 340 may be mounted on the first redistribution substrate 210. Accordingly, the first redistribution substrate 210 may be prevented from warpage, and connection failure may be reduced between the first redistribution substrate 210 and each of the connection semiconductor chip 330 and the capacitor chip 340. Therefore, it may be beneficial to improve electrical characteristics of a semiconductor package which will be further explained below.

An interposer molding layer 260 may be formed on the first redistribution substrate 210. The interposer molding layer 260 may cover the connection semiconductor chip 330, the capacitor chip 340, and the conductive posts 265.

Figure 12:
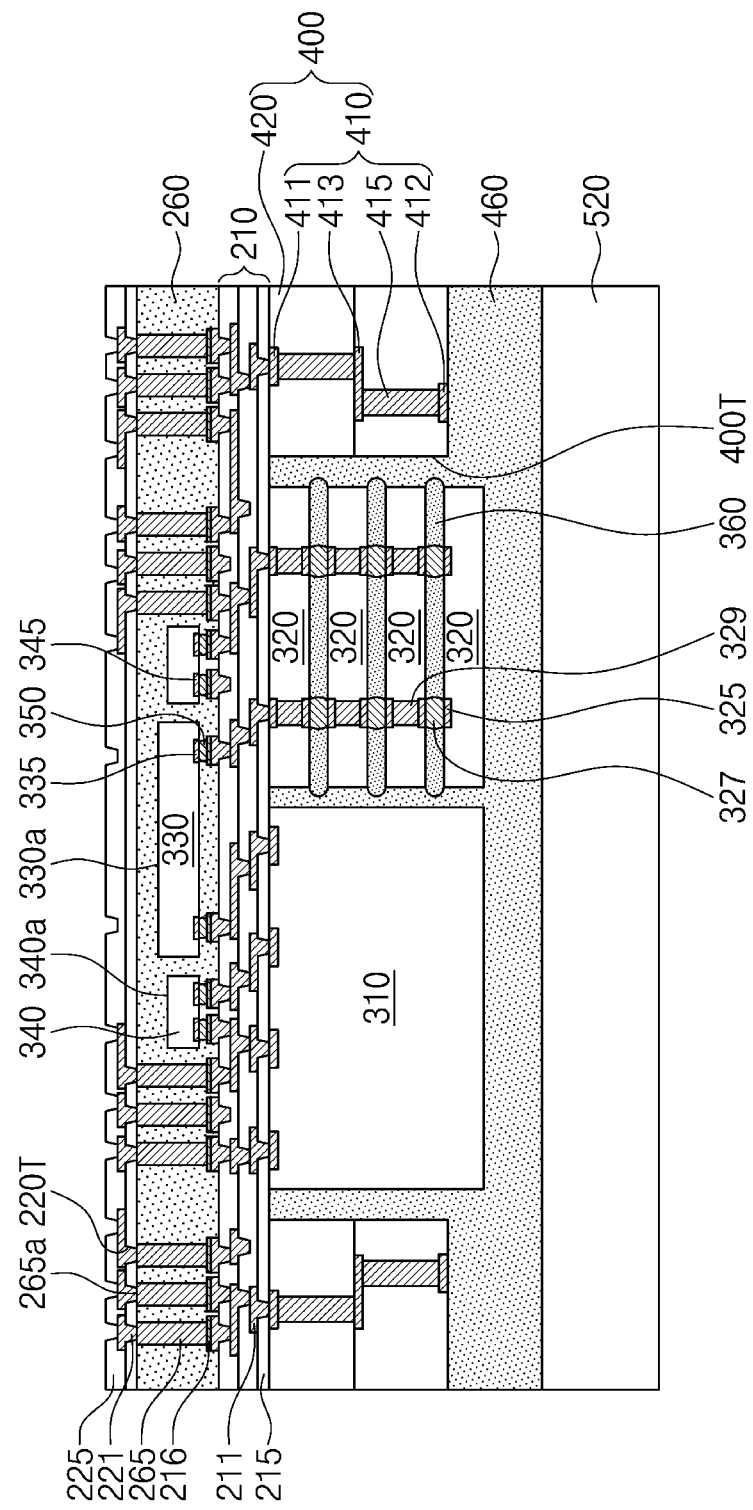

Referring to FIG. 12, the interposer molding layer 260 may undergo a grinding process to expose first surfaces 265a of the conductive posts 265. After the grinding process is completed/terminated, there may be no exposure of a first surface 330a of the connection semiconductor chip 330 or a first surface 340a of the capacitor chip 340. For example, the interposer molding layer 260 may cover the first surface 330a of the connection semiconductor chip 330 and the first surface 340a of the capacitor chip 340.

Differently from the present inventive concepts, when the grinding process exposes the first surface 330a of the connection semiconductor chip 330, the first surface 330a of the connection semiconductor chip 330 may be ground. In this case, impurities (e.g., silicon) may be created and accumulated on the conductive posts 265, and thus an interposer substrate (see 200 of FIG. 13) may be worsen in electrical characteristics. In contrast, according to the present inventive concepts, the first surface 330a of the connection semiconductor chip 330 may not be ground, and then impurities (e.g., silicon) may not be accumulated on the conductive posts 265. Accordingly, it may be beneficial to improve electrical characteristics of a semiconductor package which will be further explained below. In addition, the grinding process may be performed to expose only the first surfaces 265a of the conductive posts 265, and accordingly the grinding process may be easily executed.

A second redistribution dielectric layer 225 may be formed on the interposer molding layer 260. The second redistribution dielectric layer 225 may be patterned to form a plurality of second holes 220T in the second redistribution dielectric layer 225. The second holes 220T may expose the first surfaces 265a of the conductive posts 265. The second redistribution dielectric layer 225 may be patterned by exposure and development processes. For example, each of the second holes 220T may have a tapered shape.

Second redistribution patterns 221 may be formed on the second redistribution dielectric layer 225. For example, the formation of the second redistribution pattern 221 may include forming a seed layer on the second redistribution dielectric layer 225, performing an electroplating process in which the seed layer is used as an electrode to form a conductive layer, and patterning the seed layer and the conductive layer. The conductive layer may include or be formed of metal, such as copper (Cu). The second redistribution pattern 221 may include a second via part provided in the second hole 220T and a second wire part provided on the second redistribution dielectric layer 225.

Figure 13:
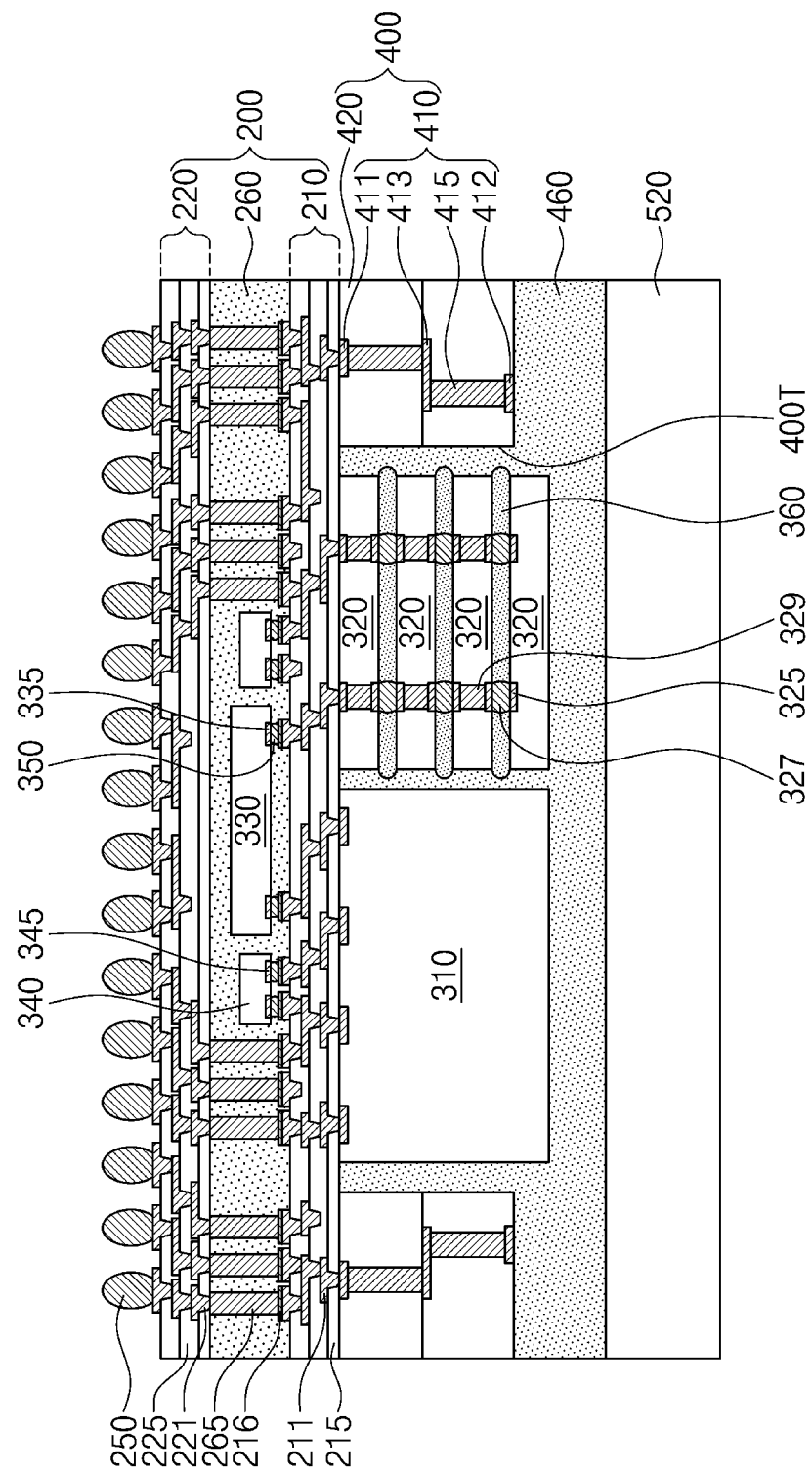

Referring to FIG. 13, the formation of the second redistribution dielectric layer 225 and the second redistribution patterns 221 may be repeatedly performed. Therefore, a second redistribution substrate 220 may be formed which includes a plurality of stacked second redistribution dielectric layers 225 and a plurality of stacked second redistribution patterns 221. Accordingly, an interposer substrate 200 may be formed which includes the first redistribution substrate 210, the interposer molding layer 260, and the second redistribution substrate 220. Interposer bumps 250 may be formed on the interposer substrate 200.

According to the present inventive concepts, the interposer molding layer 260 may undergo the grinding process to flat the interposer molding layer 260, and thereafter the second redistribution dielectric layer 225 and the second redistribution patterns 221 may be formed. As the interposer molding layer 260 is flat, it may be beneficial to form the second redistribution patterns 221 to be fine patterns. Accordingly, a pitch between the second redistribution patterns 221 that are horizontally spaced apart from each other may be less than a pitch between the first redistribution patterns 211 that are horizontally spaced apart from each other.

Figure 14:
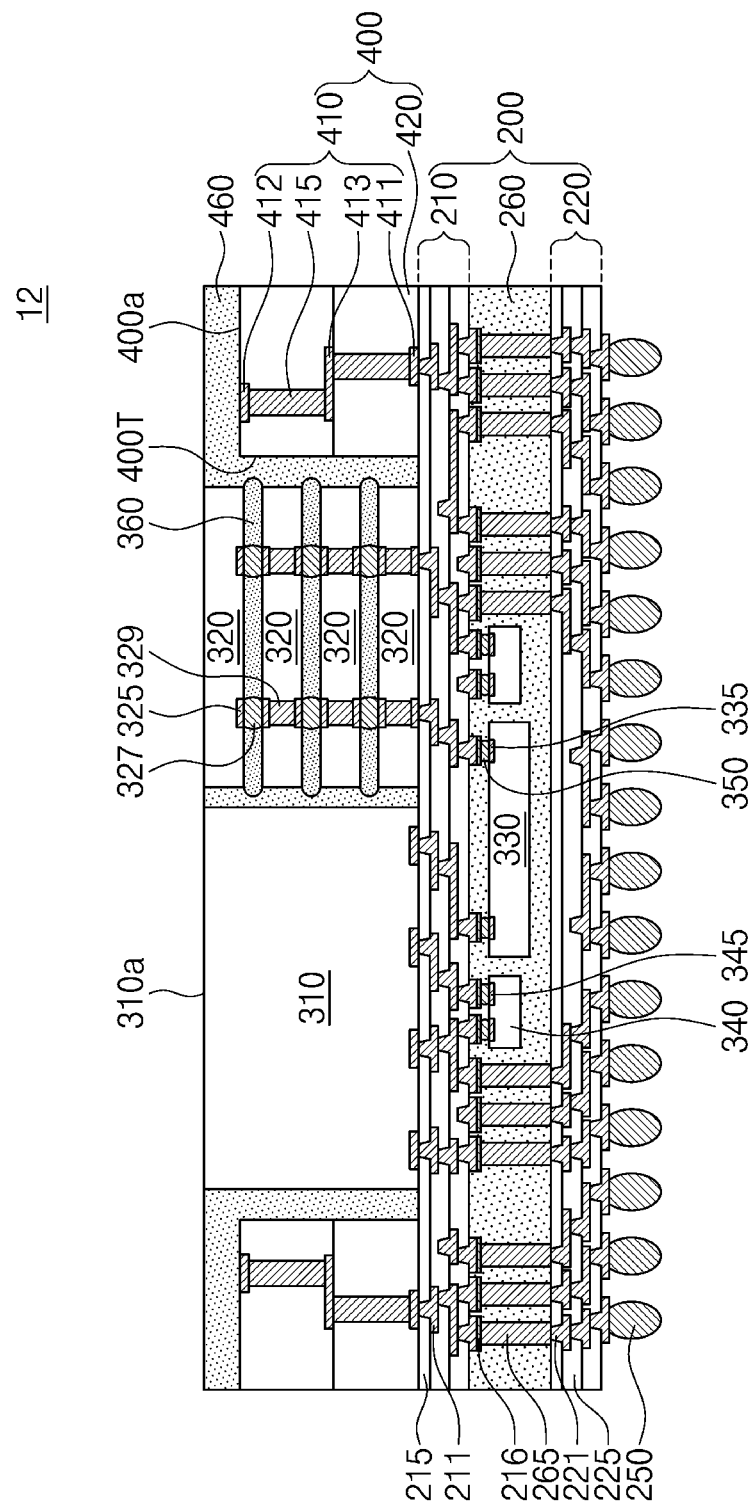

Referring to FIG. 14, the third carrier substrate 520 may be turned upside down to allow a top surface 310a of the first semiconductor chip 310 to face upwards, and then the third carrier substrate 520 may be removed. The removal of the third carrier substrate 520 may form second preliminary semiconductor packages 12 that are individually separated from each other.

The molding layer 460 may undergo a grinding process to expose the top surface 310a of the first semiconductor chip 310 and the top surface of the uppermost second semiconductor chip 320. After the grinding process is completed/terminated, a top surface 400a of the connection substrate 400 may not be exposed.

Referring back to FIGS. 1 and 2, the second preliminary semiconductor package 12 may be provided on a package substrate 100. Interposer bumps 250 may be interposed between and electrically connect the package substrate 100 and the interposer substrate 200.

A substrate under-fill layer 160 may be formed between the package substrate 100 and the interposer substrate 200. The substrate under-fill layer 160 may fill a space between the interposer bumps 250 and may encapsulate the interposer bumps 250. The processes mentioned above may fabricate a semiconductor package 10.

Figure 15:
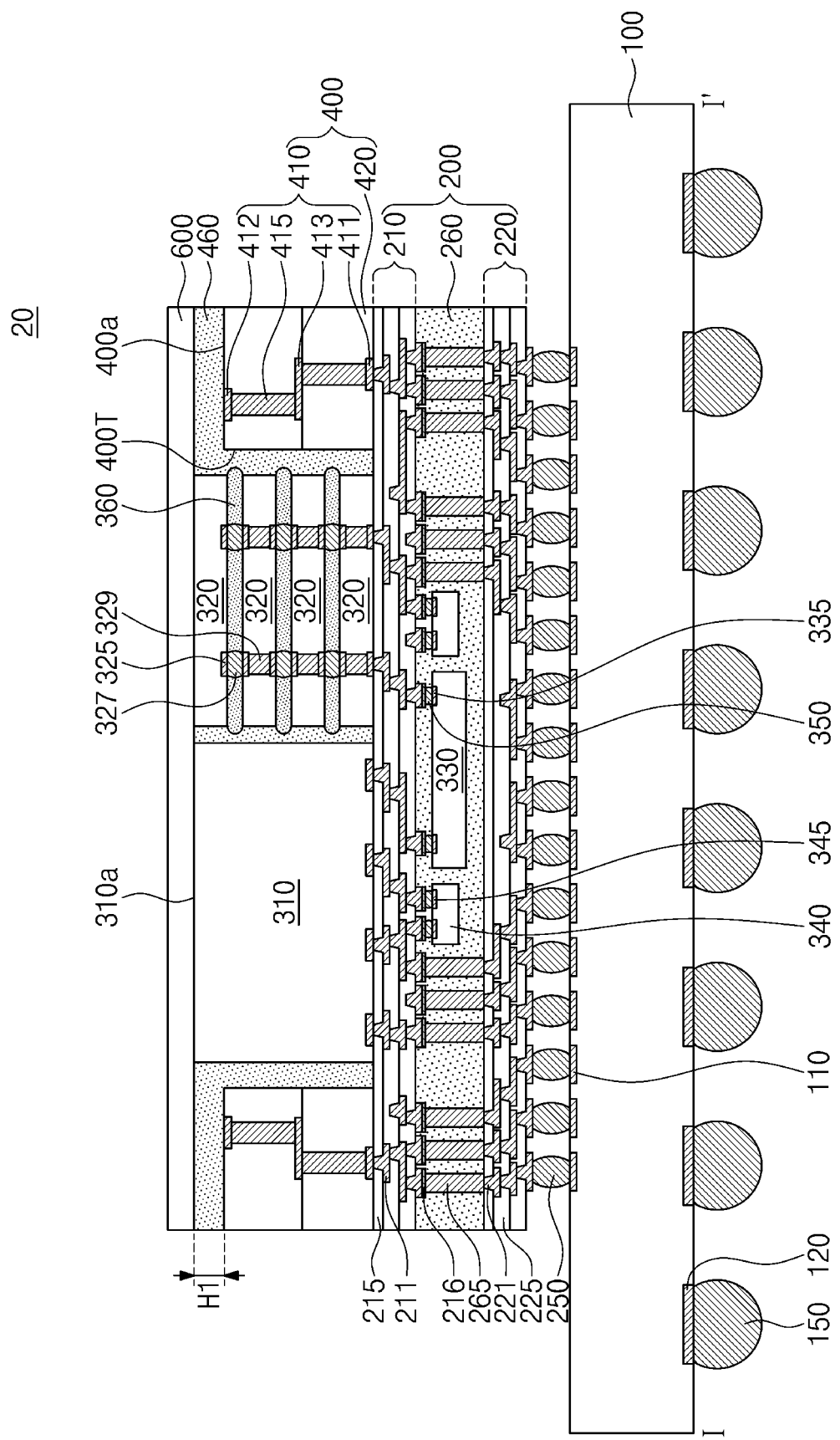
FIG. 15 illustrates a cross-sectional view taken along line I-I' of FIG. 1, showing a semiconductor package according to some embodiments of the present inventive concepts.

FIG. 15 illustrates a cross-sectional view taken along line I-I' of FIG. 1, showing a semiconductor package according to some embodiments of the present inventive concepts.

Referring to FIGS. 1 and 15, a semiconductor package 20 may include a package substrate 100, an interposer substrate 200, a first semiconductor chip 310, a second semiconductor chip 320, a connection semiconductor chip 330, a connection substrate 400, and a molding layer 460, and may further include a thermal radiation/dissipation plate 600. Duplicate descriptions of the features described above will be omitted below.

The thermal radiation/dissipation plate 600 may be disposed on at least one selected from the top surface 310a of the first semiconductor chip 310 and the top surface of the uppermost second semiconductor chip 320. For example, the thermal radiation/dissipation plate 600 may be in contact with at least one selected from the top surface 310a of the first semiconductor chip 310 and the top surface of the uppermost second semiconductor chip 320. The thermal radiation/dissipation plate 600 may extend onto and cover a top surface of the molding layer 460. The thermal radiation/dissipation plate 600 may include or may be a heat slug or a heat sink. The thermal radiation/dissipation plate 600 may include or be formed of a material, such as metal, whose thermal conductivity is high.

According to some embodiments, the semiconductor package 20 may not include the substrate under-fill layer 160 interposed between the package substrate 100 and the interposer substrate 200.

The description with reference to FIGS. 1, 2, 3, 4A, and 4B may be substantially identically applicable to the semiconductor package 20, except that the thermal radiation/dissipation plate 600 is included and the substrate under-fill layer 160 is not included. For example, components of the semiconductor package 10 described above may be the same as components of the semiconductor package 20.

According to the present inventive concepts, a semiconductor chip and a redistribution substrate may reduce or prevent connection failure resulting from warpage of the redistribution substrate during fabrication. Accordingly, a semiconductor package may be improved in electrical characteristics.

According to the present inventive concepts, as an interposer substrate is provided therein with a connection semiconductor chip and a capacitor chip, the semiconductor package may increase in the degree of freedom of design and may eventually decrease in size.

According to the present inventive concepts, as the interposer substrate is provided therein with the capacitor chip, it may be beneficial to effectively remove noise from power signals or input signals and to provide the semiconductor package with an increased power integrity.

Although the present inventive concepts have been described in connection with the embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A method of manufacturing a semiconductor package, comprising:
   providing a carrier substrate having a connection hole on a first carrier substrate;
   providing first and second semiconductor chips in the connection hole on the first carrier substrate;
   forming a molding layer covering the carrier substrate and upper surfaces of the first and second semiconductor chips;
   attaching a second carrier substrate on the molding layer;
   removing the first carrier substrate;
   turning the second carrier substrate to allow lower surfaces of the first and second semiconductor chips to face upwards;
   forming a first redistribution substrate on the lower surfaces of the first and second semiconductor chips;
   mounting a connection semiconductor chip and a capacitor chip on the first redistribution substrate, the capacitor chip horizontally spaced apart from the connection semiconductor chip;
   forming an interposer molding layer covering upper surfaces of the connection semiconductor chip; and
   forming a second redistribution substrate on the interposer molding layer.

2. The method of manufacturing the semiconductor package of claim 1, further comprising forming conductive posts on the first redistribution substrate before forming the interposer molding layer,
   wherein the conductive posts connect the first redistribution substrate and the second redistribution substrate.

3. The method of manufacturing the semiconductor package of claim 2, further comprising grinding the interposer molding layer to expose surfaces of the conductive posts before forming the second redistribution substrate.

4. The method of manufacturing the semiconductor package of claim 3, wherein an upper surface of the connection semiconductor chip is not exposed during grinding the interposer molding layer.

5. The method of manufacturing the semiconductor package of claim 1, after forming the second redistribution substrate, further comprising:
   turning the second carrier substrate upside down again to locate the lower surfaces of the first and second semiconductor chips facing downward;
   removing the second carrier substrate; and
   grinding the molding layer to expose upper surfaces of the first and second semiconductor chips.

6. The method of manufacturing the semiconductor package of claim 5, wherein the molding layer covers an upper surface and a sidewall of the carrier substrate, and sidewalls of the first and second semiconductor chips.

7. The method of manufacturing the semiconductor package of claim 5, further comprising disposing a thermal dissipation plate contacting at least one of the upper surfaces of the first and semiconductor chips after grinding the molding layer.

8. The method of manufacturing the semiconductor package of claim 1, wherein an upper surface of the first semiconductor chip is at a lever higher than a level of an upper surface of the carrier substrate.

9. The method of manufacturing the semiconductor package of claim 1, wherein mounting the capacitor chip horizontally spaced apart from the connection semiconductor chip on the first redistribution before forming the interposer molding layer.

10. The method of manufacturing the semiconductor package of claim 1, wherein the first redistribution substrate includes a first redistribution dielectric layer and first redistribution patterns in the first redistribution dielectric layer, and wherein each of the first redistribution patterns includes a first wire part and a first via part on the first wire part.

11. The method of manufacturing the semiconductor package of claim 10, wherein the second redistribution substrate includes a second redistribution dielectric layer and second redistribution patterns in the second redistribution dielectric layer, wherein each of the second redistribution patterns includes a second wire part and a second via part on the second wire part.

12. The method of manufacturing the semiconductor package of claim 1, wherein an upper surface and a lower surface of the connection semiconductor chip are covered by the interposer molding layer.

13. The method of manufacturing the semiconductor package of claim 1, wherein a first portion of the connection semiconductor chip vertically overlaps a portion of the first semiconductor chip, and a second portion of the connection semiconductor chip vertically overlaps a portion of the second semiconductor chip.

14. A method of manufacturing a semiconductor package, comprising:

providing a carrier substrate having a connection hole on a first carrier substrate;

providing first and second semiconductor chips in the connection hole on the first carrier substrate;

forming a preliminary molding layer covering the carrier substrate and upper surfaces of the first and second semiconductor chips;

attaching a second carrier substrate on the preliminary molding layer;

removing the first carrier substrate;

turning the second carrier substrate to allow lower surfaces of the first and second semiconductor chips to face upwards;

forming a first redistribution substrate including a first redistribution dielectric layer and first redistribution patterns in the first redistribution dielectric layer, on the lower surfaces of the first and second semiconductor chips;

forming conductive patterns connected to the first redistribution patterns on the first redistribution substrate;

forming conductive posts on the conductive patterns on an edge region of the first redistribution substrate;

mounting a connection semiconductor chip connected to the conductive patterns and a capacitor chip horizontally spaced apart from the connection semiconductor chip on a center region of the first redistribution substrate;

forming an interposer molding layer covering upper surfaces of the connection semiconductor chip;

forming a second redistribution substrate including a second redistribution dielectric layer and second redistribution patterns in the second redistribution dielectric layer, on the interposer molding layer, turning the second carrier substrate again to allow the lower surfaces of the first and second semiconductor chips to face downwards;

removing the second carrier substrate; and forming a molding layer by grinding the preliminary molding layer to expose upper surfaces of the first and second semiconductor chips.

15. The method of manufacturing the semiconductor package of claim 14, further comprising disposing a thermal dissipation plate contacting at least one of the upper surfaces of the first and semiconductor chips after forming a molding layer.

16. The method of manufacturing the semiconductor package of claim 14, an upper surface and lower surface of the connection semiconductor chip are covered by the interposer molding layer.

17. The method of manufacturing the semiconductor package of claim 14, the molding layer covers an upper surface of the carrier substrate, and the molding layer exposes a top surface of the first semiconductor chip and a top surface of the second semiconductor chip.

18. The method of manufacturing the semiconductor package of claim 14, wherein the carrier substrate includes a conductive structure and a base layer, wherein the conductive structure is connected to the first redistribution substrate.

19. The method of manufacturing the semiconductor package of claim 18, wherein the conductive structure is connected to the conductive posts on the edge region of the first redistribution substrate.

20. The method of manufacturing the semiconductor package of claim 14, wherein a first portion of the connection semiconductor chip vertically overlaps a portion of the first semiconductor chip, and a second portion of the connection semiconductor chip vertically overlaps a portion of the second semiconductor chip.

* * * * *